United States Patent [19]

Calviello et al.

[11] Patent Number: 4,876,176

[45] Date of Patent: Oct. 24, 1989

[54] METHOD FOR FABRICATING QUASI-MONOLITHIC INTEGRATED CIRCUITS

[75] Inventors: Joseph A. Calviello, Kings Park; Paul R. Bie, Commack; Ronald J. Pomian, Dix Hills, all of N.Y.

[73] Assignee: Eaton Corporation, Cleveland, Ohio

[21] Appl. No.: 40,416

[22] Filed: Apr. 20, 1987

[51] Int. Cl.$^4$ .............................................. G03C 5/00
[52] U.S. Cl. ..................................... 430/311; 430/316; 430/318; 437/51; 437/177; 437/184; 437/192; 437/195; 437/919; 357/41; 357/51
[58] Field of Search ............... 430/314, 316, 317, 318, 430/319, 311; 357/16, 41, 51; 437/51, 177, 184, 192, 195, 919

[56] References Cited

U.S. PATENT DOCUMENTS 4,789,645  12/1988  Calviello et al. ..................... 437/51

OTHER PUBLICATIONS

Calviello et al., "First Successful Fabrication of High Performance All Refractive-Metal (TaAu) FET . . . ," Electronic Letters, vol. 22(10), May 1986, pp. 510–512.

Calviello et al., "Quasi-Monolithic . . . ," Microwave Journal, May 1986, pp. 243–254.

Primary Examiner—Jose G. Dees
Attorney, Agent, or Firm—Andrus, Sceales, Starke & Sawall

[57] ABSTRACT

Method for fabrication of quasi-monolithic microwave integrated circuits in which metals, oxides, and processes are selected to enable fabrication of the circuits by first producing many layers of metals and oxides in situ without removing the circuit from its environmental chamber. This reduces inclusion of contaminating chemical films and particles between the desired layers. Circuit elements are then defined by processing of the layers by photolithography and other processes from the top of the circuit downward. Lumped and distributed capacitors, resistors, inductors, transmission lines, and contacts for active devices are monolithically defined, with a reduced number of process steps.

9 Claims, 4 Drawing Sheets

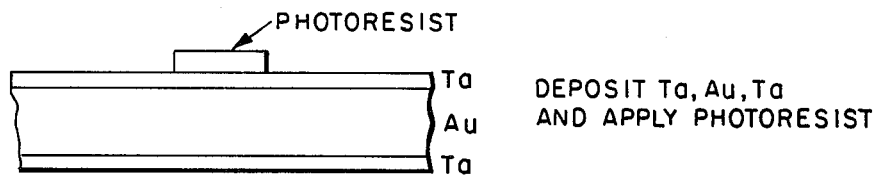
Fig. 11 — DEPOSIT Ta, Au, Ta AND APPLY PHOTORESIST
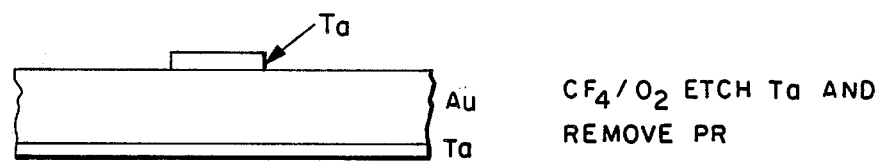
Fig. 12 — $CF_4/O_2$ ETCH Ta AND REMOVE PR
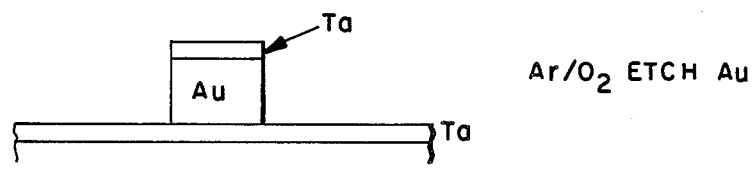
Fig. 13 — $Ar/O_2$ ETCH Au
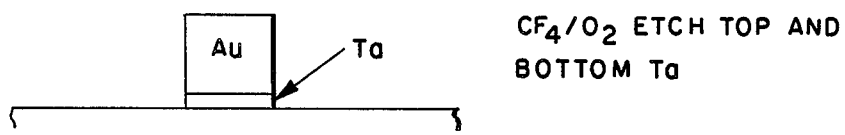
Fig. 14 — $CF_4/O_2$ ETCH TOP AND BOTTOM Ta

METHOD FOR FABRICATING QUASI-MONOLITHIC INTEGRATED CIRCUITS

FIELD

This invention relates to processes for fabricating quasi-monolithic semiconductor integrated circuits, including circuits suitable for operation at microwave and millimeter signal wavelengths.

PRIOR ART

Microwave integrated circuit fabrication processes have been used to fabricate circuits by diffusion of passive circuit elements and conductor networks on a single chip of silicon, followed by addition of active elements such as transistors by bonding them to the chips. Circuits of this type fabricated on GaAS substrates have shown promising characteristics.

One of the problems with prior fabrication processes is that contaminants such as chemical films and dust particles from the ambient environment have drastically reduced the product yields, reliability, and performance. Because of the nature of the metallurgies and sequences of processing operations employed, the prior art circuits have ordinarily been removed from processing chambers several times during their fabrication, and so have been exposed to atmospheres more contaminated than those within the processing chambers. Broadly speaking, the prior structures have been fabricated from the bottom up, that is, by starting at strata at or slightly below the "top" surface of the substrate and proceeding upward to superstructure layers.

SUMMARY

By the use of this invention semiconductor circuits including ones operable in the microwave to millimeter wavelength ranges are produced by performing many steps of their fabrication without removing them between those steps from the chamber in which they are processed. This type of fabrication was made possible by devising ways to first lay down many layers of various materials on the substrate, in situ within a chamber, then to produce the elemental structures of the circuits from the top down, all by processes and metallurgies that are selected to permit such a sequence of fabrication. For some products, the number of fabrication processes is reduced by this method.

Thus, multiple layers of metals and oxides are deposited successively in situ. These are the layers that are needed later to define passive circuit elements (both distributed and lumped), and interconnecting conductors.

The superimposed layers are produced sequentially in a chamber, which serves as a high vacuum system, sputtering system, and/or other processing system, without removing the semiconductor circuit from the chamber. This reduces the exposure of the desired layers to contaminants such as chemical films and dust particles. the reduction of contaminants increases the yield, reliability and performance of the semiconductors that are produced.

Photolithography and other processes then follow; they act upon the layers of materials that were deposited earlier, to define circuit elements. Subsequently, active devices may be affixed to the integrated circuit chips to form complete circuits.

Circuits that are produced by the invented method, with their active components affixed to a completed chip, are referred to here as Quasi-Monolithic Microwave Integrated Circuits, (QMMICs). They have high yields and performance, and are usable both (a) as products and (b) as process development prototypes for subsequent fully Monolithic Microwave Integrated Circuit (MMIC) products. MMIC fabrication methods are described and claimed in copending application Serial No. 040,418 filed Apr. 20, 1987, now U.S. Pat. No. 4,789,645, issued Dec. 6, 1988, in the names of Joseph A. Calviello, Paul R. Bie and Ronald J. Pomian and assigned to the assignee of this invention.

An object of the invention is to provide a fabrication method for producing integrated circuits of higher yield and improved performance.

An object is to provide an improved fabrication method for producing quasi-monolithic integrated circuits for use as microwave and millimeter circuits.

An object is to provide a method for fabricating QMMICs in which the sequence in which circuit elements are fabricated and the metallurgy and processes employed enable a great amount of fabrication processing without removing the integrated circuit from the environmental chamber in which many steps of the processing takes place.

An object is to provide a method for fabricating QMMICs in which the sequence in which circuit elements are fabricated and the metallurgy and processes employed are selected so as to enable processing with fewer steps.

An object is to provide a method for fabricating QMMICs in which contamination between layers is reduced.

An object is to provide a method for producing semiconductor circuits in which performance of subcircuits within a wafer is improved and subcircuits are more uniform among wafers.

An object is to adapt a fully plasma dry etch process to the fabrication of QMMICs.

An object is to provide fabrication methods for producing QMMIC semiconductor circuits in which yields are improved because passive circuits and active devices that are capable of functioning adequately can be selectively combined for use in large circuits.

An object is to provide fabrication methods for producing QMMIC semiconductor circuits in which all metals and oxide layers necessary to define all of the lumped circuit elements (R's, L's, C's, and conductors) of a system are deposited in situ to reduce chemical contamination and introduction of dust particles between deposited layers.

An object is to provide fabrication methods employing in situ deposition for producing QMMIC semiconductor circuits in which Ta, $Ta_2O_5$ and Au metallurgy are adopted for fabricating R's, L's, C's (both interdigitated and overlayer C's), distributed networks and microstrip circuits.

An object is to provide fabrication methods for producing QMMIC semiconductor products which are of comparable size and weight to MMIC products.

A further object of the invention is to provide fabrication methods for producing QMMIC semiconductor circuits utilizing a technology base that is common to the fabrication of both active circuits and passive elements/circuits, to enable the subsequent development of cost-effective MMICs.

BRIEF DESCRIPTION OF THE DRAWINGS

FIGS. 11, 12, 13, and 14 show successive steps in the fabrication of a distributed network portion of the MMIC mixer.

DETAILED DESCRIPTION

Figure 1:
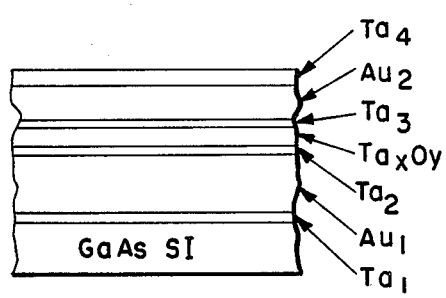
FIG. 1 is a cross sectional view of a semiconductor circuit during fabrication illustrating the result of steps of depositing layers by evaporation and sputtering processes.

The successful development of cost effective and high performance monolithic integrated circuits, such as microwave circuits, requires improvements in processes, metallurgy, circuit design and configuration, including the following.

(a) Development of a plasma dry etch process to achieve uniformity over a full wafer surface.

(b) Reliable metallurgy that is diffusion resistant to GaAs, Au, and to neighboring metals (as in multi-level metallization), and is easily bondable.

(c) The processes and metallurgy used in the lumped and distributed elements of the passive circuits should be very similar to those used for fabrication of the active devices involved, if any, such as diodes and low noise and power FETs, if the QMMIC circuits are to lead to subsequent development of fully monolithic microwave integrated circuits.

(d) For good microwave performance the substrate should be semi-insulating gallium arsenide (abbreviated SI GaAs), or GaAs on high resistivity substrate, etc. For some purpose silicon can be used.

One factor in fulfilling these requirements is the selection of Ta, Mo, W, Ta/Si, Mo/Si, W/Si, Ta/N, Mo/N, or W/N as a metallurgy system suitable for the future Schottky junctions, with a thick gold overlayer. Another factor is the development of lumped resistors, inductors, and capacitors, (R's, L's and C's), as well as distributed networks on SI GaAs using that metallurgy, as explained further below.

The system of metallurgy that was devised made it possible to fabricate lumped R's, L's and C's (including both interdigitated and overlayer capacitors), distributed components and networks, and microstrip circuits by means of in situ deposition of all of the necessary metal and oxide layers. For the particular example of a system being described, Ta, $Ta_2O_5$ and Au were adopted. Other compounds could be used as well, e.g., $SiO_2$, $Si_3N_4$, etc. A fully plasma dry etch process was employed to fabricate passive circuits, and it was compatible also with later processes involving active devices.

For large overlayer capacitors prior methods suffered from excessive dust particles on the wafers' surfaces, especially if the processing area in which the circuits were fabricated was only of class 10,000 cleanliness or poorer. When all of the metal and oxide layers necessary for defining the lumped elements (R's, L's and C's) are deposited in situ, chemical contamination and dust particles between deposited layers are greatly reduced, resulting in overlayer capacitors having excellent Q's and yield. For example, the Q at 2 GHz for a 0.6 pf capacitor made by this process is almost 150 and for a 5 pf capacitor Q is greater than 14, with an associated yield greater than 95%.

Dielectric constants for the capacitors can be controlled by selection of the integers X, Y, and Z in the formula $Ta_XSi_YO_Z$, or by using other dielectrics such as $SiO_2$, $Si_3N_4$, etc.

Explanation of the invented method is facilitated by describing examples of production of specific circuits by the method.

IF Amplifier. One circuit that was developed and produced using the foregoing method is a 2 to 6 GHz quasi-monolithic IF amplifier. Discrete lumped elements for the IF amplifier were first designed, optimized and evaluated, with SI GaAs as the substrate. High vacuum deposited tantalum was used for the purpose of improving adherence to GaAs and adjacent layers, as well as to fabricate resistors, and as a mask for defining the lumped elements by means of a dry etch plasma process that was developed for use in the fabrication. Sputtering of Ta could be done as well.

Gold was used for defining microstrip circuits, conductors, interdigitated capacitors and overlayer capacitors. Tantalum pentoxide ($Ta_2O_5$), which was derived from Ta using reactive plasma deposition, was used as a 1000 A thick dielectric for overlayer capacitors.

The major processing steps for fabricating the quasi-monolithic IF amplifier with the foregoing metallurgy are illustrated in FIGS. 1 through 8. They show the definition first of the overlayer capacitors, then microstrip lines and inductors, and finally the tantalum resistors. The substrate thickness is then reduced to 5 mills. Air bridges are formed to connect the overlayer capacitors and inductors to the microstrip circuit. "Via holes" are defined to provide for a connection of the circuit through the substrate to ground.

Referring now to the detailed drawings, the structure of FIG. 1 results from the following steps:

(1) evaporate (or sputter) $Ta_1$ (1000 A)
(2) evaporate (or sputter) $Au_1$ (3.0 um)
(3) sputter deposit $Ta_2$ (200 A)
(4) sputter deposit $Ta_XO_Y$ (1500 A)
(5) sputter deposit $Ta_3$ (400 A)
(6) sputter Au (1.5 um)
(7) sputter deposit $Ta_4$ (3000 A).

Figure 2:
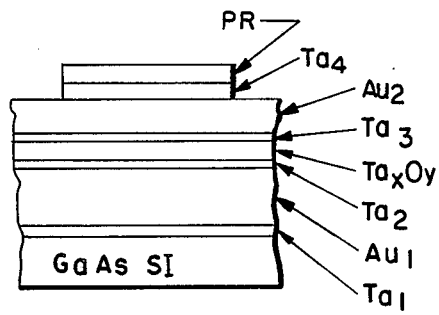
FIG. 2 is a cross section illustrating photoprocessing by masking and plasma etching.

The structure of FIG. 2 is produced by these steps:

(1) apply photoresist
(2) photoprocess for mask $IF_1$ (circuit pattern)
(3) plasma etch $Ta_4$ with $CF_4$, 100u, 30w.

Figure 3:
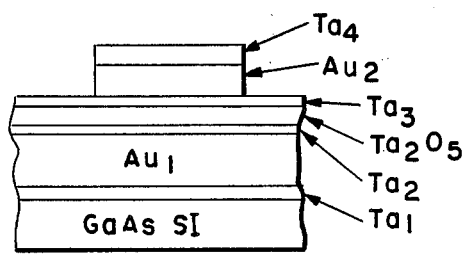
FIG. 3 is the circuit after removal of photoresist and following plasma etching.

The steps of FIG. 3 are:

(1) remove photoresist (2) plasma etch $Au_2$ with $ArO_2$, 10u, 60w. In this step $Ta_4$ is being oxidized by the $O_2$ in Ar and then used as a mask while gold is being etched by AR.

Figure 4:
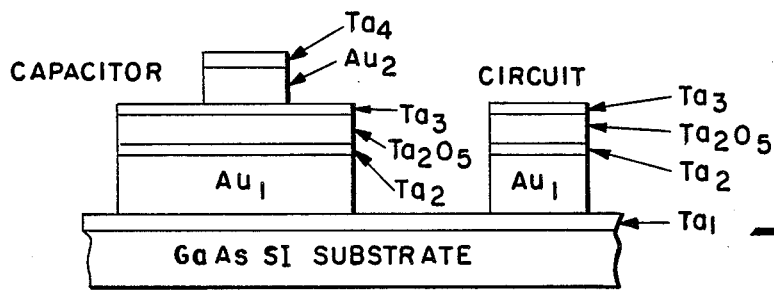
FIG. 4 results from application of photoresist and photoprocessing, plasma etching, and related steps.

In FIG. 4 some steps involved in producing a capacitor and circuit are illustrated as follows:
(1) apply photoresist
(2) photoprocess for mask $IF_2$ (capacitor electrode)
(3) plasma etch:
   $Ta_3$ with $CF_4$, 100u, 30w
   $Ta_2O_5$ with $CF_4$, 100u, 30w
   $Ta_2$ with $CF_4$, 100u, 30w
(4) Remove photoresist
(5) plasma etch:
   $Au_1$ and $Au_2$ with $ArO_2$, 10u, 60w
(6) measure capacitor values.

Figure 5:
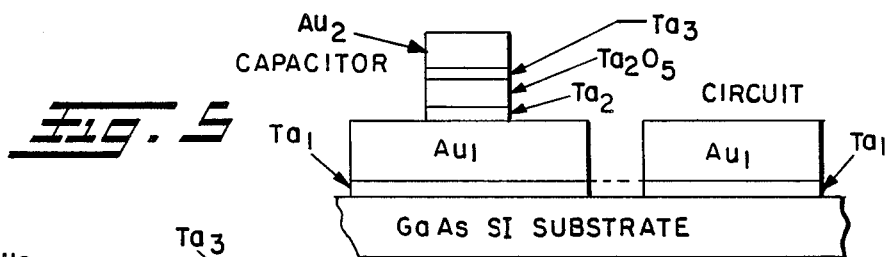
FIG. 5 illustrates further steps of photoprocessing and etching to assist in defining a capacitor and circuit connection.

In FIG. 5 the typical capacitor and circuit are further developed by means of the following steps:
(1) apply photoresist
(2) photoprocess for mask $IF_3$ (capacitor dielectric)
(3) plasma etch consecutively:
   $Ta_3$, $Ta_2O_5$, and $Ta_2$ with $CF_4$, 100u, 30w
   $Ta_1$ with $CF_4$, 100u, 30w
(4) remove photoresist
(5) define top Ta and Ta-Ta oxide.

Figure 6:
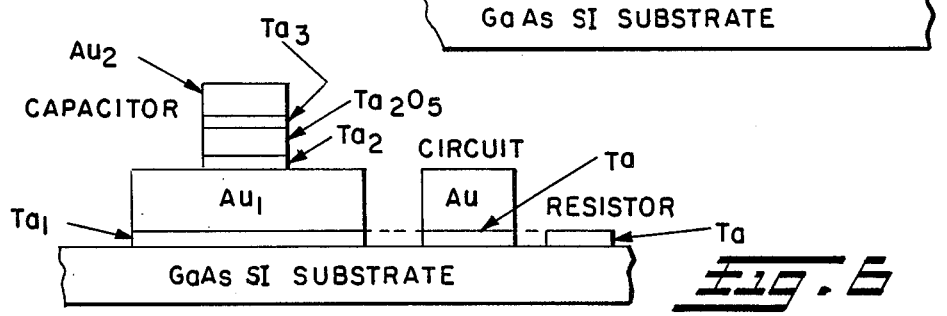
FIG. 6 shows further photoprocessing, and etching with Au cyanide to produce a resistor.

In FIG. 6 development of a resistor is portrayed. The steps are:
(1) apply photoresist
(2) photoprocess for mask $IF_4$ (resistor)
(3) etch Au over the resistor pattern with Au cyanide
(4) remove photoresist
(5) measure the resistor value.

Figure 7:
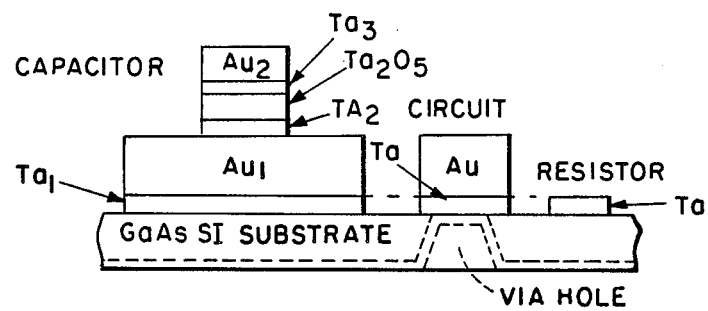
FIG. 7 shows the result of lapping of the wafer, photoprocessing, chemical etching via holes, and sputter deposition of gold.

FIG. 7 includes the lapping step:
(1) lap wafer to 5 mils
(2) apply photoresist
(3) photoprocess for mask $IF_5$ (via hole)
(4) chemically etch GaAs
(5) remove photoresist
(6) sputter deposit Ta (500 A) and Au (1000 A to 10,000 A)
(7) evaporate Au (2.0 u).

Figure 8:
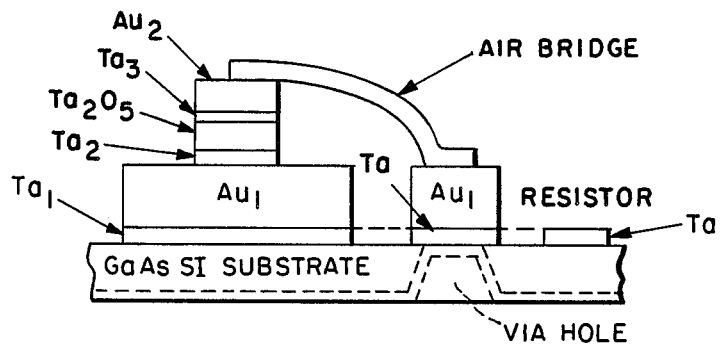
FIG. 8 shows masking, evaporation, photoprocessing and definition of an air bridge.

In FIG. 8 the air bridge is developed:
(1) apply photoresist
(2) photoprocess for mask $IF_6$ (first air bridge pattern)
(3) evaporate Au (3000 A) and Mo (300 A)
(4) apply photoresist
(5) photoprocess for mask $IF_7$ (second air bridge pattern)
(6) pulse plate Au (3 to 10 u)
(7) remove photoresist and define the air bridge.

Figure 9:
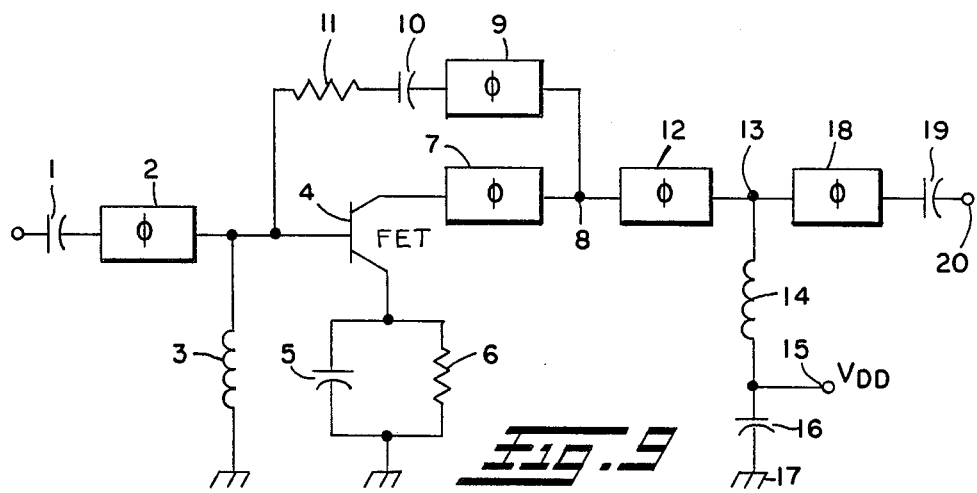
FIG. 9 is a schematic circuit diagram of a quasi-monolithic intermediate frequency amplifier produced by the invented process, for use in the 2 to 6 GHz frequency range.

FIG. 9 shows an equivalent circuit of the IF amplifier. It includes an input coupling capacitor 1 and a length of transmission line 2 leading in series to a shunt inductor 3 that connects to ground. The line 2 is connected to the gate of a metal oxide field effect transistor (MESFET) 4 whose source is connected to ground through a parallel arrangement of a capacitor 5 and resistor 6 for bias. The drain of the MESFET 4 connects through a transmission line 7 to an intermediate output point 8, which divides to a feedback circuit comprising in series a transmission line 9, a capacitor 10 and a resistance 11 which connects to the gate of the MESFET 4.

The other circuit path from point 8 leads through a transmission line 12 to a circuit point 13 from which two circuits diverge. The first is through an inductor 14 to a power supply terminal 15 and a shunt capacitance 16 to ground 17. The other path from terminal 13 is a transmission line 18 in series with an output coupling capacitor 19 to an output terminal 20.

The process described resulted in quasi-monolithic amplifier yields in excess of 90%, with high repeatability. The gain of the IF amplifier varies from slightly more than 9 dB at 2000 MHz to about 11 dB at 6000 MHz. Its noise figure varies between 3.5 dB and 2.85 dB between the frequency limits 2000 to 6000 MHz. No trimming of any kind was performed on these chips.

Figure 10:
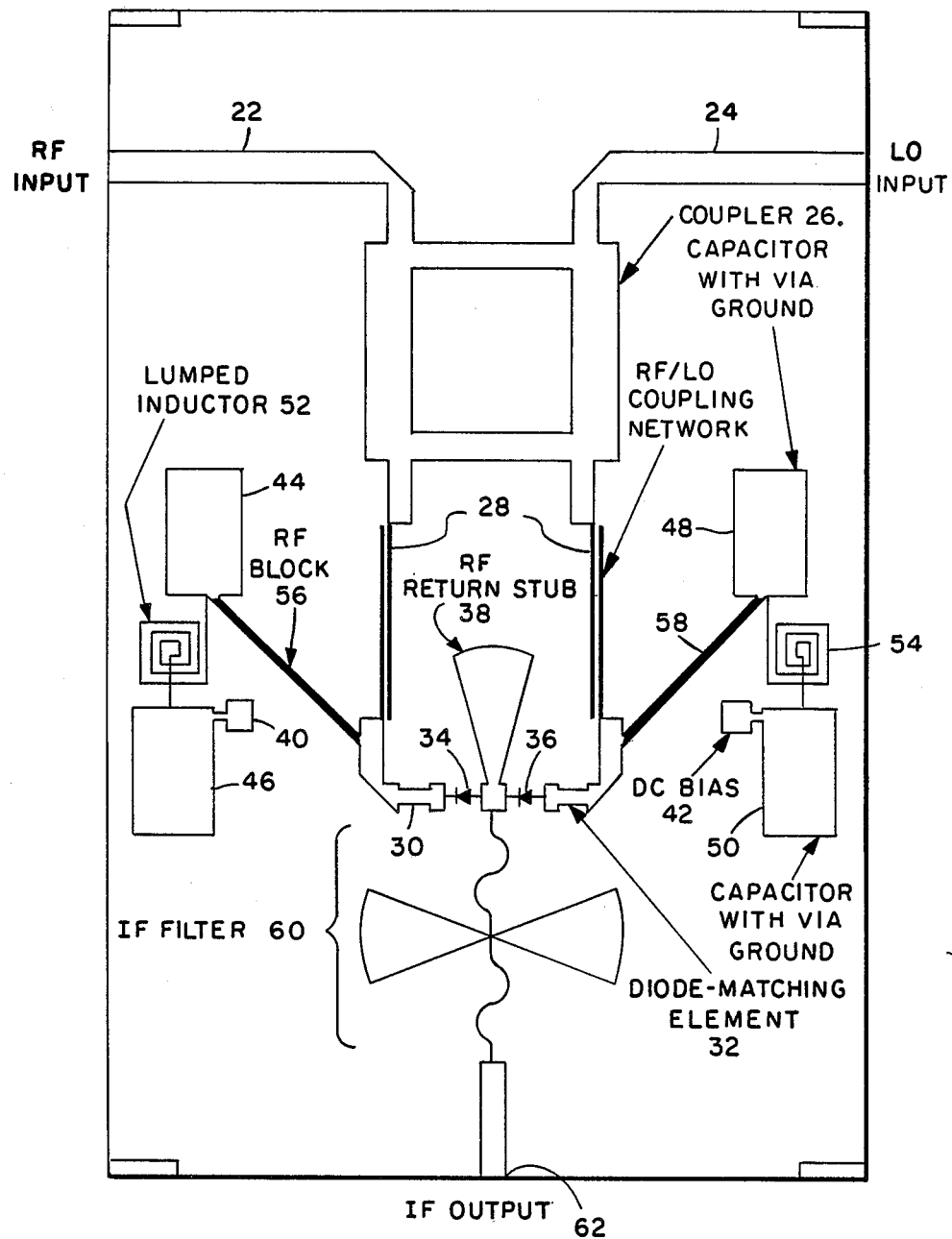
FIG. 10 is a layout diagram of a balanced 35 GHz QMMIC mixer fabricated by the invented process.

Quasi-Monolithic Mixer. By way of further example of the invented method, a quasi-monolithic mixer, whose circuit layout diagram is in FIG. 10, was fabricated. It includes a tantalum-gold-base distributed network comprising RF and local oscillator input lines 22, 24, feeding a hybrid coupler 26, and coupling networks 28 to diode-matching elements 30, 32. Mixer diodes 34, 36 connect to an RF return stub 38. DC bias terminals 40, 42 are provided with RF isolation from the diode matching elements by 60 pF capacitors 44, 46, 48, and 50, and 3.5 nH inductors 52, 54, and narrow RF blocking transmission lines 56, 58. An IF output filter 60 is interposed between the junction of the diodes and an IF output terminal 62.

A method has been developed involving processes, metallurgy and oxides that are common to the fabrication of passive elements, interconnecting circuits, and if desired later, active devices. The method makes possible the fabrication largely in situ of the chip portions of cost effective quasi-monolithic integrated circuits, including ones suitable for microwave and millimeter use.

The invented method can produce QMMIC circuits that are very similar in respect of substrate, metallurgy, and processes to products producible by fully monolithic methods. The quasi-monolithic microwave integrated circuit approach, although presently limited (by the cost of affixing the active devices) to analog systems and thus low scale integration, can achieve the promising properties of some future large scale MMICs, including low cost, high performance, small size, high reliability and reproducibility.

Use of the QMMICs makes it possible to optimize processes and circuit performance which enable later fabrication of MMICs, which are likely to be more cost-effective. A particular design of MMIC can be created by first developing a QMMIC, then developing an MMIC of similar substrate, metallurgy and processes.

Most components of the circuits are individually testable by known techniques, for example by using probes.

We claim:
1. A method for producing a quasi-monolithic integrated circuit comprising the steps of:
   (a) enclosing a substrate in an environmentally isolated chamber;
   (b) producing over a substantial portion of a surface of the substrate at least five superimposed layers of metals and oxides, wherein said metals include at least one from the group tantalum, molybdenum, tungsten, and gold, and wherein said oxides include at least one from the group of oxides of tantalum, molybdenum, and tungsten;
   (c) removing the circuit from said chamber;
   (d) sequentially processing patterned areas of said layers substantially from the exposed top layer downward, to define and produce circuit elements forming a partially complete integrated circuit, by processes including photolithography; and (e) bonding active circuit elements to the partial circuit to complete the fabrication of the quasi-monolithic circuit.

2. A method as in claim 1 and wherein said step of producing superimposed layers of metals and oxides comprises producing layers which include compounds of $Ta_2O_5$.

3. A method as in claim 1 and wherein the order of producing the circuit elements of step D includes: (a) defining capacitors, (b) defining circuit conductors, and (c) defining resistors.

4. A method as in claim 3 and wherein said step of producing circuit elements comprises producing both distributed and lumped circuit elements.

5. A method as in claim 1 and wherein said integrated circuit comprises a substrate of SI GaAs.

6. A method as in claim 1 and wherein said circuit elements comprise a layered capacitor on SI GaAs substrate and said step of producing said layers comprises producing them by the following procedures:
   produce a first Ta layer;
   produce a first Au layer;
   sputter deposit a second Ta layer;
   sputter deposit $Ta_xO_y$ where X and Y are integers;
   sputter deposit a third Ta layer;
   sputter deposit a second Au layer;
   sputter deposit a fourth Ta layer.

7. A method as in claim 6 and wherein at least one of said steps of producing a first Ta layer and of producing a first Au layer comprises producing by an evaporation process.

8. A method as in claim 6 and wherein at least one of said steps of producing a first Ta layer and of producing a first Au layer comprises producing by a sputtering process.

9. A method as in claim 6 and wherein said step of sequentially processing patterned areas comprises defining a layered capacitor on SI GaAs substrate as follows:
   (i) photolithographically defining a first electrode for a capacitor in said second Au layer by the following procedures
   apply photoresist;
   photoprocess for a first mask;
   plasma etch said fourth Ta layer with $CF_4$;
   remove photoresist;
   plasma etch said second Au layer with $ArO_2$;
   and,
   (ii) photolithographically defining a second electrode in said first Au layer by the following procedures
   apply photoresist;
   photoprocess for a second mask;
   plasma etch said third Ta layer and said $Ta_xO_y$ layer and said second Ta layer with $CF_4$;
   remove photoresist; and
   plasma etch said first and second Au layers with $ArO_2$.

* * * * *